United States Patent [19]

Powell

[11] Patent Number: 4,977,478

[45] Date of Patent: Dec. 11, 1990

[54] CONTACT STATUS DETECTOR

[75] Inventor: William E. Powell, Raleigh, N.C.

[73] Assignee: Alcatel NA, Inc., Hickory, N.C.

[21] Appl. No.: 335,060

[22] Filed: Apr. 7, 1989

[51] Int. Cl.$^5$ ............................................. G01R 31/02
[52] U.S. Cl. .................................. 361/160; 340/644; 324/418
[58] Field of Search ........... 340/644, 686, 687, 825.16, 340/825.18; 324/415, 418, 420–423, 537; 361/160, 170, 179; 307/360, 308, 112, 116, 119, 125, 130

[56] References Cited

U.S. PATENT DOCUMENTS 4,575,718 3/1986 Ludowyk ....................... 340/825.17
4,689,570 8/1987 Ohgaki et al. ...................... 324/418
4,777,479 10/1988 Hinckley .............................. 340/644

*Primary Examiner*—Todd E. DeBoer
*Assistant Examiner*—David Osborn
*Attorney, Agent, or Firm*—Peter C. Van Der Sluys

[57] ABSTRACT

By providing two comparators, each of which have a reference voltage level source connected to one input, and separate voltage level producing/enhancing circuits connected to the contacts of a relay, so that each alternate switch configuration produces a different voltage level at the two comparators, a unique relay switch detection circuit is attained. Preferably, three separate voltage level producing/enhancing circuits are employed, with one circuit connected between the relay output and the two comparators, while the other two circuits are connected to the primary or the secondary relay contacts. Futhermore, the voltage level resulting from each particular switch configuration is pre-set relative to the reference voltage level source imputs to assure that the two comparators produce different combined outputs for each alternate switched condition.

9 Claims, 1 Drawing Sheet

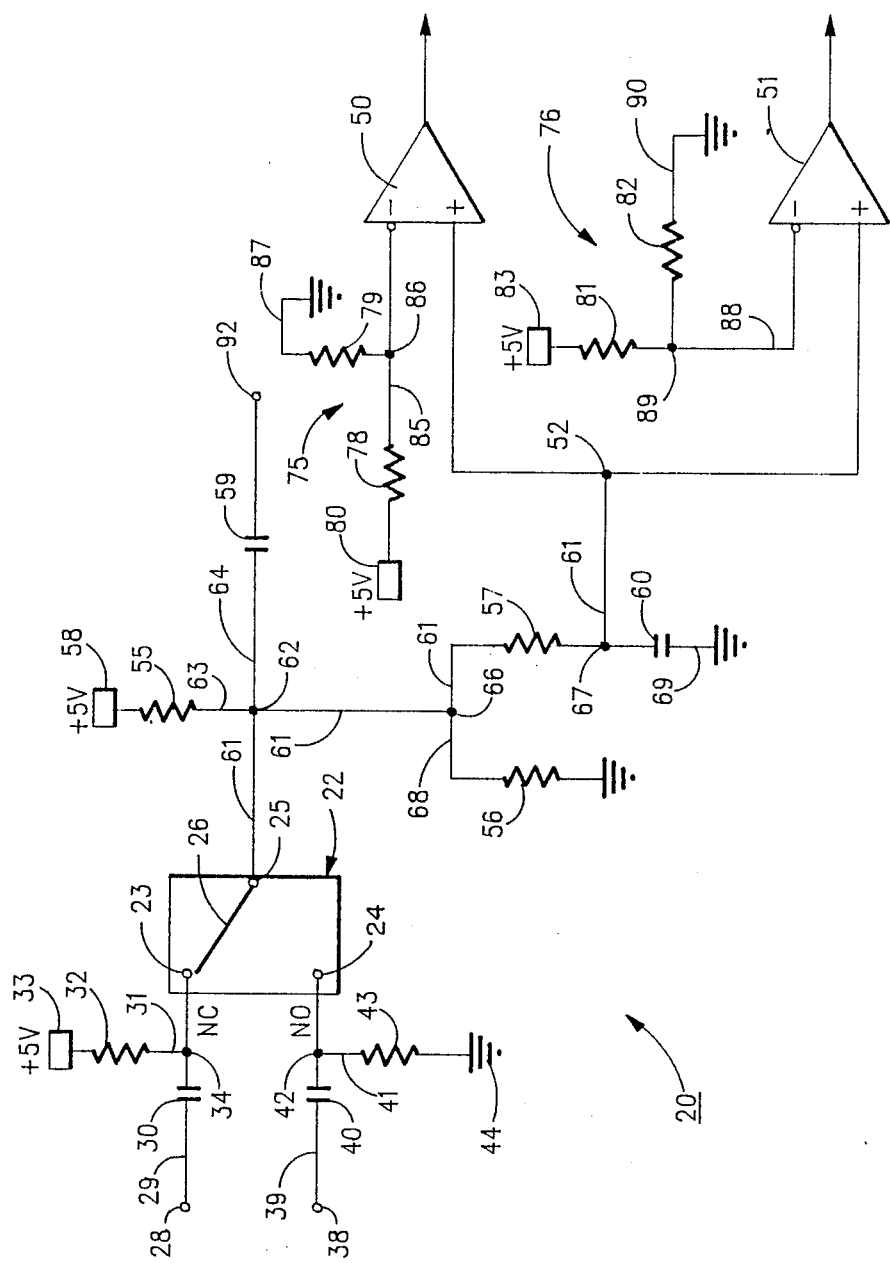

CONTACT STATUS DETECTOR

BACKGROUND OF THE INVENTION

1. Field of the Invention

This invention relates to contact status detectors, and more particularly to a closure detection circuit for use with relays.

2. Description of the Prior Art

In electrical circuits incorporating a plurality of signal carrying switches, it is often desirable to have a positive indication of the status of the switch, in order to assure that the circuit is in the desired switched configuration. Typically, this need is particularly desirable in circuits employing relays.

In view of this need, prior art systems have been developed to provide some type of relay switch detection capability. However, these prior art systems typically require the use of a separate set of contacts to indicate the particular status of the relay. Furthermore, these prior art systems tend to be unreliable, since the actual relay contacts are not monitored directly.

In addition, prior art systems for use with relays monitor only the primary and secondary contacts of the relay and are generally incapable of providing a signal when the relay is stuck between its two alternate contacts.

Consequently, it is a principal object of the present invention to provide a contact status detection circuit which is capable of directly monitoring switches, in general, and relay contacts, in particular, to determine the status of the contacts.

Another object of the present invention is to provide a contact status detection circuit having the characteristic features described above which is also capable of directly monitoring all relay contact status conditions including when the relay is stuck between its two alternate contacts, and providing a separate and unique output signal for each possible condition.

Other and more specific objects will in part be obvious and will in part appear hereinafter.

SUMMARY OF THE INVENTION

The contact status detector of the present invention overcomes the prior art difficulties by providing a positive, direct signal for each of the alternate conditions in which the contacts being monitored may be found. Although the present invention can be employed with equal efficacy to monitor any cooperating signal carrying, multi-position contacts, the present invention is of particular use in determining the status of relay contacts. Consequently, the present invention will be described in detail in relation to its use with a conventional two-position relay.

In the preferred embodiment, the contact status detector circuit of the present invention incorporates two comparators, with each comparator connected at one input thereof to a pre-set reference voltage source. The second input of each of the two comparators is connected in common to the common contact of the relay being monitored.

In addition, a resistor and voltage source network is connected between the relay and the two comparators to deliver a specific voltage level to the two comparators. Furthermore, two separate voltage level altering circuits are connected independently to the input side of the relay contacts, thereby causing different voltage levels to be delivered to the comparator depending upon which contact is closed.

As a result, the contact status detector circuit of the present invention develops three distinct voltage levels depending upon the status of the relay contacts. One voltage level is attained when the primary, normally closed contact is closed, a second separate and distinct voltage level is produced when the secondary normally open contact is closed, and a third unique voltage level is produced when the switch is stuck between the two contacts and both contacts are open. Each of these voltage levels is delivered to the two comparators depending upon the particular status of the contacts of the relay. Since each voltage level is unique and distinct, due to the use of the particular circuit arrangement, the reference voltages connected to the other inputs of the two comparators are selected to assure that a specific output is attained from each comparator, depending upon the particular switch status of the relay. In this way, the output of the two comparators, provides a positive indication when the relay contacts are (1) in their normally closed position, (2) in their normally open position, or (3) stuck in between the two positions.

The invention accordingly comprises the features of the circuit, the combination of elements and the arrangement of circuit components which will be exemplified in the circuit hereinafter set forth, and the scope of the invention will be indicated in the claims.

THE DRAWING

For a fuller understanding of the nature and objects of the invention, reference should be had to the following detailed description taken in connection with the accompanying drawing in which:

The FIGURE is a schematic representation of the preferred embodiment of the contact status detector circuit of the present invention.

DETAILED DESCRIPTION OF THE PREFERRED EMBODIMENT

The contact status detector of the present invention may be employed in a variety of circuit arrangements to determine the actual status of one or more signal carrying contacts to be monitored. However, in the preferred embodiment, the contact status detector of the present invention is employed in monitoring relays. For purposes of explanation, without intending to be limited thereby, the drawing discloses the contact status detector circuit of the present invention monitoring a latching relay.

As shown in the FIGURE, contact status detector circuit 20 of the present invention incorporates a latching relay 22 having a normally closed contact 23, a normally open contact 24, and a common output contact 25 to which switch means 26 is movably mounted.

Contact 23 is connected to pin 28 along line 29. In addition, an isolating capacitor 30 is connected on line 29 between contact 23 and pin 28. Line 31 is also connected to line 29 at junction 34, between capacitor 30 and pin 23, with line 31 incorporating a resistor 32 and a voltage source 33. In the preferred embodiment, voltage source 33 comprises five volts.

Contact 24 is connected to pin 38 along line 39. Line 39 also incorporates an isolating capacitor 40 mounted thereto. Furthermore, line 41 is connected to line 39 at junction 42 and incorporates resistor 43 connected thereto with line 41 terminating at ground connection 44.

On the opposed side of relay 22, common contact 25 is connected directly to comparators 50 and 51 through common junction 52. In addition, the signal being transmitted from common contact 25 to common junction 52 is determined by resistors 55, 56 and 57 which are selected to attain a desired voltage level at junction 52. Also, a voltage source 58, preferably five volts, is connected to resistor 55 to establish the desired voltage level at junction 52.

Completing the circuit, are capacitors 59 and 60 which cooperate with capacitors 30 and 40 to isolate this circuit and assure that the voltage levels being presented to comparators 50 and 51 are not influenced by external sources and to isolate the rest of the circuit from the DC levels introduced by this contact status circuitry.

In the preferred circuit configuration, common contact 25 is connected to common junction 52 along line 61. Line 61 also incorporates junction 62 to which line 63 and 64 are connected. Line 63 comprises resistor 55 and voltage source 58, while line 64 comprises capacitor 59 connected to a pin 92.

Between junction 62 and junction 52, line 61 also incorporates two additional junctions 66 and 67. Line 68 is connected to junction 66 as resistor 56 is mounted thereto with the terminating end thereof connected to ground. Line 69 is connected to junction 67 and comprises capacitor 60 mounted thereto with the terminating end of line 69 also connected to ground. Completing this circuit is resistor 57 which is mounted to line 61 between junction 66 and junction 67.

Although the resistors employed in the circuit of the present invention can comprise a variety of alternate values, in order to attain a particular voltage level, in the preferred embodiment, resistors 32 and 43 each comprise a resistance of 10 kilohms, while resistors 55, 56 and 57 each comprise a resistance of 100 kilohms.

In order to assure that comparators 50 and 51 provide a desired output depending upon the voltage level present at junction 52, each of the comparators 50 and 51 have one of their inputs connected to a reference or control voltage level circuit. As shown in the FIGURE, one of the inputs of comparator 50 is connected to control voltage level circuit 75, while comparator 51 has one of its inputs connected to control voltage level circuit 76.

Control voltage level circuit 75 comprises resistor 78 mounted to line 85 between voltage source 80 at one end and one of the inputs of comparator 50 at the other end. In addition, line 85 incorporates a junction 86 to which line 87 is connected. Resistor 79 is mounted to line 87 between junction 86 and ground. In the preferred embodiment, resistor 78 comprises a resistance value of 61.9 kilohms, voltage source 80 comprises five volts and resistor 79 comprises a resistance value of 100 kilohms.

In control voltage level circuit 76, resistor 81 is mounted to line 88 which extends between a voltage source 83 at one end thereof and one of the inputs of comparator 51 at the other end thereof. In addition, line 88 comprises a junction 89 positioned between resistor 81 and comparator 51. Line 90 is connected to junction 89 and extends therefrom to ground, with resistor 82 mounted therebetween. In the preferred embodiment, resistor 81 comprises a resistance value of 232 kilohms, voltage source 83 comprises five volts, and resistor 82 comprises a value of 100 kilohms.

By employing the preferred construction for control voltage level circuits 75 and 76, circuit 75 provides a control or reference voltage of about three volts to one of the inputs of comparator 50. The preferred configuration of reference voltage level circuit 76 provides a controlled reference voltage of about 1.7 volts to one of the inputs of comparator 51.

By employing these particular reference voltage levels in combination with the preferred resistor values detailed above for circuit 20 of the present invention, the status of each contact of relay 22 is directly and precisely monitored.

When relay 22 is in its normally closed position, with contact 23 closed, resistors 32, 55, 56, and 57 are all operative, producing a voltage level of about 4.5 volts at junction 52. Since this voltage level is greater than the voltage level both comparators 50 and 51 receive at their other inputs, both comparators 50 and 51 output a one.

In the preferred embodiment, the outputs of comparators 50 and 51 are transmitted to a combinatorial circuit (not shown) which is constructed to distinguish between all of the different output combinations of comparators 50 and 51 and provide its own output signal which effectively details the particular status of relay 22. In this way, the user is informed of the precise status of the contacts.

In one of its alternate configurations, normally open contact 24 is closed. In this configuration, resistors 55, 43, 56 and 57 are actively connected to produce a voltage of about 0.45 volts at junction 52. Since this voltage level is less than the voltage levels being inputted to comparators 50 and 51 at their other inputs from the reference voltage circuits, both comparators 50 and 51 output a zero. As described above, the combinatorial circuit (not shown) upon receipt of a one signal from comparator 50 and a one signal from comparator 51 produces an output signal informing the user that contact 24 is closed.

The final configuration in which relay 22 can be found is to have the relay stuck between contacts 23 and 24. In this configuration, resistors 55, 56 and 57 are operative and provide a voltage level of about 2.5 volts at junction 52. With a 2.5 volt level being delivered to one of the inputs of comparator 50, comparator 50 outputs a zero since reference voltage circuit 75 connected to the opposed input is about 3 volts, exceeding the voltage level at junction 52.

Comparator 51, however, outputs a one, since reference voltage circuit 76 connected to the input of comparator 51 provides a voltage level less than the voltage level at junction 52. In the same manner as detailed above, the signals are delivered to the combinatorial circuit (not shown) which provides an output signal informing the user that relay 22 is stuck between the two contact positions.

As is apparent from the foregoing detailed disclosure, the contact status detector of the present invention provides a precise, direct monitoring of the actual status of any signal carrying contacts. In this way, the user immediately knows the precise status of the contacts with the assurance that the contacts are in the precise status being monitored, since the signal is carried along the contacts and not in any alternate error-inducing manner.

It will thus be seen that the objects set forth above, among those made apparent from the preceding description, are efficiently attained and, since certain changes may be made in the above circuit, without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Having described my invention, what I claim as new and desire to secure by Letters Patent is:

1. A relay closure detection circuit for detecting the actual status of the contacts of a relay, said circuit comprising:
   A. a relay including a primary contact, a secondary contact, and a common contact associated with a switch means movable between the primary and secondary contacts;
   B. a first comparator having a first input connected to the common contact of the relay;
   C. a second comparator having a first input connected to the first input of the first comparator;
   D. a first reference signal source, connected to a second input of the first comparator for providing a first reference signal level thereto;
   E. a second reference signal source connected to a second input of the second comparator for providing a second reference signal level less than the first reference signal level;
   F. a first signal producing/enhancing circuit connected between the common contact of the relay and the first inputs of said first and second comparators for providing a first signal level thereto;
   G. a second signal producing/enhancing circuit connected to the primary contact of the relay; and
   H. a third signal producing/enhancing circuit connected to the secondary contact of the relay;
   whereby the signal level applied to the first inputs of said comparators varies depending upon the switch means of the relay being connected to the primary contact, the secondary contact or no contact, thereby allowing the comparators to compare the signal levels received at the first inputs with the reference signals received at the second inputs of said comparators and determine the precise status of the relay.

2. The relay closure detection circuit defined in claim 2, wherein the first signal producing/enhancing circuit is further defined as separately providing a first signal level less than the signal level produced by the first reference signal source and greater than the signal level produced by the second reference signal source, whereby each of the comparators produce different logic level signals whenever the switch means is not connected to either the primary or secondary relay contacts.

3. The relay detection circuit defined in claim 2, wherein
   I. the second signal producing/enhancing circuit is further defined as combining with the first signal producing/enhancing circuit, when the switch means connects the common contact to the primary contact, to produce a signal level at the first inputs of the comparators which is greater than the signal level of both the first and second reference signal levels; and
   J. the third signal producing/enhancing circuit is further defined as combining with the first signal producing/enhancing circuit, when the switch means connects the common contact to the secondary contact, to produce a signal level at the first inputs of the first and second comparators which is less than the signal level of both the first and second reference signal levels;
   whereby both of the comparators produce the same logic level signal when the primary contact of the relay is connected to the common contact and produce an opposite logic level signal when the secondary contact of the relay is connected to the common contact, thereby allowing the output signals of the comparators to be processed for informing the user of the precise status of the relay contacts.

4. The relay closure detection circuit defined in claim 1, wherein said circuit is further defined as comprising capacitors connected to each of the relay contacts for isolating signals produced by the first, second and third reference signals producing/enhancing circuits from any external circuitry connected to the relay.

5. A switch monitoring circuit for detecting the actual status of contacts of a switch having a primary contact, a secondary contact, and a common contact associated with a switch arm movable between the primary and secondary contacts, said circuit comprising:
   A. A first comparator having a first input connected to the common contact;
   B. a second comparator having a first input connected to the first input of the first comparator;
   C. a first reference signal source, connected to a second input of the first comparator for providing a first reference signal level thereto;
   D. a second reference signal source connected to a second input of the second comparator for providing a second reference signal level less than the first reference signal level;
   E. a first signal producing/enhancing circuit connected between the common contact and the first inputs of said first and second comparators for providing a first signal level thereto;
   F. a second signal producing/enhancing circuit connected to the primary contact; and
   G. a third signal producing/enhancing circuit connected to the secondary contact;
   whereby the signal level applied to the first inputs of said comparators varies depending upon the switch arm being connected to the primary contact, the secondary contact or no contact, thereby allowing the comparators to compare the signal levels received at the first inputs with the reference signals received at the second inputs of said comparators and determine the precise status of the switch.

6. The switch monitoring circuit defined in claim 5, wherein the first signal producing/enhancing circuit is further defined as separately providing a first signal level less than the signal level produced by the first reference signal source and greater than the signal level produced by the second reference signal source, whereby each of the comparators produce different logic level signals whenever the switch arm is not connected to either the primary or secondary contacts.

7. The switch monitoring circuit defined in claim 6, wherein

H. the second signal producing/enhancing circuit is further defined as combining with the first signal producing/enhancing circuit, when the switch arm connects the common contact to the primary contact, to produce a signal level at the first inputs of the comparators which is greater than the signal level of both the first and second reference signal levels; and I. the third signal producing/enhancing circuit is further defined as combining with the first signal producing/enhancing circuit, when the switch arm connects the common contact to the secondary contact, to produce a signal level at the first inputs of the first and second comparators which is less than the signal level of both the first and second reference signal levels;

whereby both of the comparators produce the same logic level signal when the primary contact is connected to the common contact and produce an opposite logic level signal when the secondary contact is connected to the common contact, thereby allowing the output signals of the comparators to be processed for informing the user of the precise status of the switch contacts.

8. The switch monitoring circuit defined in claim 5, wherein said circuit is further defined as comprising capacitors connected to each of the contacts for isolating signals produced by the first, second and third reference signal producing/enhancing circuits from any external circuitry connected to the switch.

9. A switch monitoring circuit for detecting the actual status of switch contacts in a switch including a plurality of contacts and a common contact associated with a switch arm movable to selected ones of said plurality of contacts, said circuit comprising:

a comparator for each of said plurality of contacts, said comparators each having a first and second input, each said first input connected to the common contact;

a plurality of reference signal sources each connected to one of said second inputs of comparators for providing a different reference signal level to each comparator;

a first signal producing/enhancing circuit connected between the common contact and the first inputs of each comparator for providing a first signal level thereto;

a plurality of signal producing/enhancing circuits, each connected to one of said plurality of contacts and providing a different signal level thereto, whereby the signal level applied to the first inputs of said comparators varies depending upon the selected contact to which the switch arm is connected, thereby allowing the comparators to compare the signal levels received at the first inputs with the reference signals received at the second inputs of said comparators and determine the precise status of the switch.

* * * * *

UNITED STATES PATENT AND TRADEMARK OFFICE
CERTIFICATE OF CORRECTION

PATENT NO. : 4,977,478

DATED : December 11, 1990

INVENTOR(S) : William E. Powell

It is certified that error appears in the above-identified patent and that said Letters Patent is hereby corrected as shown below:

```
At column 5, line 52, please delete "2" and
insert --1--.
```

Signed and Sealed this

Seventh Day of April, 1992

Attest:

HARRY F. MANBECK, JR.

*Attesting Officer*     *Commissioner of Patents and Trademarks*